US006831450B2

United States Patent
Kogan

(10) Patent No.: US 6,831,450 B2
(45) Date of Patent: Dec. 14, 2004

(54) ELECTRONIC METHOD AND APPARATUS FOR MEASURING OPTICAL WAVELENGTH AND LOCKING TO A SET OPTICAL WAVELENGTH OF FABRY-PEROT TUNABLE CAVITY OPTO-ELECTRONIC DEVICES

(75) Inventor: Yakov Kogan, Bedford, MA (US)

(73) Assignee: Nortel Networks, Ltd., St. Laurent (CA)

( * ) Notice: Subject to any disclaimer, the term of this patent is extended or adjusted under 35 U.S.C. 154(b) by 128 days.

(21) Appl. No.: 10/264,060

(22) Filed: Oct. 3, 2002

(65) Prior Publication Data

US 2003/0076083 A1 Apr. 24, 2003

Related U.S. Application Data

(60) Provisional application No. 60/348,230, filed on Oct. 19, 2001.

(51) Int. Cl.[7] .......................... G01N 27/00; G01B 11/02
(52) U.S. Cl. ........................ 324/71.1; 324/708; 356/506
(58) Field of Search ............................... 324/71.1, 707, 324/708; 356/454, 480, 506

(56) References Cited

U.S. PATENT DOCUMENTS

| | | | | |
|---|---|---|---|---|
| 4,225,236 A | * | 9/1980 | Sandercock | 356/454 |
| 5,909,280 A | * | 6/1999 | Zavracky | 356/454 |
| 6,563,968 B2 | * | 5/2003 | Davis et al. | 385/12 |

* cited by examiner

Primary Examiner—Jay Patidar
Assistant Examiner—Timothy J. Dole
(74) Attorney, Agent, or Firm—John C. Gorecki, Esq.

(57) ABSTRACT

Apparatus and methods are provided for measuring a selected optical behavior of a tunable opto-electric device by using the electrical characteristics of the opto-electronic device. The benefit of the present invention is the elimination or reduction in complexity of optical wavelength reference hardware that is currently required for wavelength referencing and locking. Accordingly, the present invention reduces the cost and complexity of the optical packaging of tunable opto-electronic telecommunication components. Furthermore, the present invention also significantly simplifies optical and electronic design of system level products with tunable opto-electronic devices.

20 Claims, 4 Drawing Sheets

ELECTRONIC METHOD AND APPARATUS FOR MEASURING OPTICAL WAVELENGTH AND LOCKING TO A SET OPTICAL WAVELENGTH OF FABRY-PEROT TUNABLE CAVITY OPTO-ELECTRONIC DEVICES

REFERENCE TO PENDING PRIOR PATENT APPLICATION

This patent application claims benefit of prior U.S. Provisional Patent Application Ser. No. 60/348,230, filed Oct. 19, 2001 for ELECTRONIC METHOD AND APPARATUS FOR MEASURING OPTICAL WAVELENGTH AND LOCKING TO A SET OPTICAL WAVELENGTH OF FABRY-PEROT TUNABLE CAVITY OPTO-ELECTRONIC DEVICES, which patent application is hereby incorporated herein by reference.

FIELD OF THE INVENTION

The present invention relates to semiconductor optoelectronic devices in general and, more particularly, to wavelength tunable surface emitting semiconductor lasers and wavelength tunable filters.

BACKGROUND OF THE INVENTION

Tunable wavelength Fabry-Perot based filters and VCSELs find a variety of applications in WDM telecommunications equipment. The wavelength tunability of these devices originates from the Fabry-Perot cavity gap change under the influence of a control signal. The tuning curve function describing the relationship between the control signal and the wavelength of the filter passband or the lasing wavelength is usually highly dependent on environmental conditions and changes with time due to polarization effects in the structure. In a first case, which involves WDM systems where the transmission channel wavelength has to comply with ITU grid, it is very important to precisely lock the lasing wavelength of a tunable laser to a particular wavelength value on the grid. In a second case, which involves tunable add/drop applications, the tunable laser must also be locked to a particular ITU channel. In a third case, which involves scanning applications, it is important to know the passband wavelength at a given moment in time to identify the ITU channel that the system is sampling. The first two cases are referred to as wavelength locking. The third case is known as wavelength referencing.

SUMMARY OF THE INVENTION

In accordance with an aspect of the present invention, a method and apparatus are provided for using the electrical characteristics of an opto-electronic device to measure the optical behavior of that device. The benefit of the present invention is the elimination or significant reduction of optical wavelength reference hardware that is currently required for wavelength referencing and locking. Accordingly, the present invention reduces the cost and complexity of the optical packaging of tunable opto-electronic telecommunication components. Furthermore, the present invention also significantly simplifies optical and electronic design of system level products with tunable opto-electronic devices. It is important to note that optical and electrical wavelength locking and referencing techniques do not mutually exclude each other and can be combined in many different ways to compliment each other.

The above and other features of the invention, including various novel details of constructions and combinations of parts, and other advantages, will now be more particularly described with reference to the accompanying drawings and pointed out in the claims. It will be understood that the particular method and apparatus embodying the invention are shown by way of illustration and not as a limitation of the invention. The principles and features of this invention may be employed in various and numerous embodiments without departing from the scope of the invention.

BRIEF DESCRIPTION OF THE DRAWINGS

These and other objects and features of the present invention will be more fully disclosed by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

In pending prior U.S. patent application Ser. No. 10/136,057, filed Apr. 29, 2002 by Parviz Tayebati et al. for MICROELECTROMECHANICALLY TUNABLE, CONFOCAL, VERTICAL CAVITY SURFACE EMITTING LASER AND FABRY-PEROT FILTER (Attorney's Docket No. CORE-33 CON 2), and in pending prior U.S. patent application Ser. No. 09/543,318, filed Apr. 5, 2000 by Peidong Wang et al. for SINGLE MODE OPERATION OF MICROELECTROMECHANICALLY TUNABLE, HALF-SYMMETRIC, VERTICAL CAVITY SURFACE EMITTING LASERS (Attorney's Docket No. CORE-53 CON), and in pending prior U.S. patent application Ser. No. 09/750,434, filed Dec. 28, 2000 by Peidong Wang et al. for TUNABLE FABRY-PEROT FILTER AND TUNABLE VERTICAL CAVITY SURFACE EMITTING LASER (Attorney's Docket No. CORE-67), there are disclosed tunable Fabry-Perot filters and tunable vertical cavity surface emitting lasers (VCSEL's). The three aforementioned patent applications are hereby incorporated herein by reference.

Figure 1:
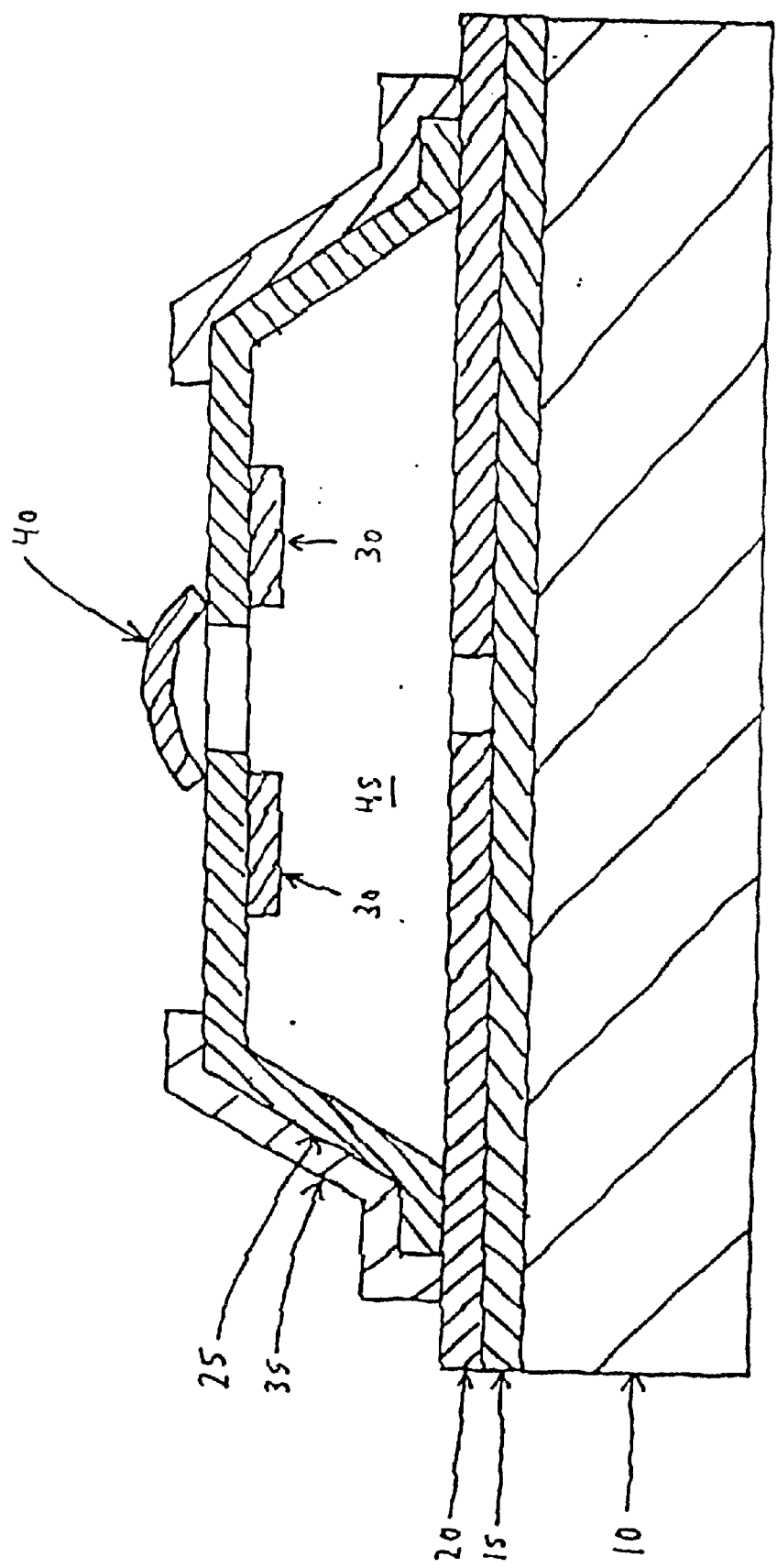
FIG. 1 is a schematic side sectional view of a tunable Fabry-Perot filter.

Looking now at FIG. 1, there is shown a tunable Fabry-Perot filter 5. Filter 5 generally comprises a substrate 10, a bottom mirror 15 mounted to the top of substrate 10, a bottom electrode 20 mounted to the top of bottom mirror 15, a thin membrane support 25 atop bottom electrode 20, a top electrode 30 fixed to the underside of thin membrane support 25, a reinforcer 35 fixed to the outside perimeter of thin membrane support 25, and a confocal top mirror 40 set atop thin membrane support 25, with an air cavity 45 being formed between bottom mirror 15 and top mirror 40.

As a result of this construction, a Fabry-Perot filter is effectively created between top mirror 40 and bottom mirror 15. Furthermore, by applying an appropriate voltage across top electrode 30 and bottom electrode 20, the position of top mirror 40 can be changed relative to bottom mirror 15, whereby to change the length of the Fabry-Perot cavity, and hence tune Fabry-Perot filter 5.

Figure 2:
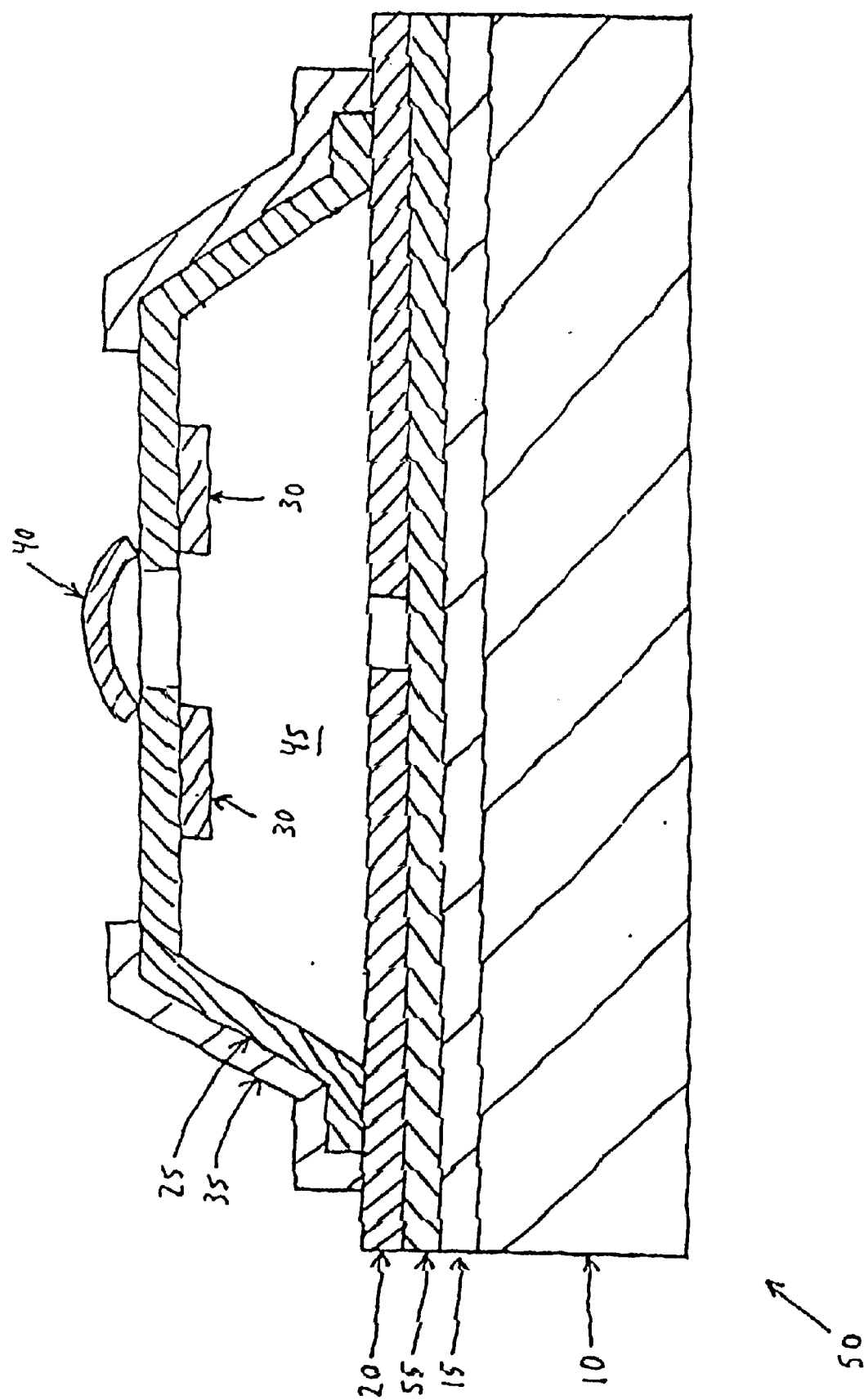
FIG. 2 is a schematic side sectional view of a tunable VCSEL.

Correspondingly, and looking next at FIG. 2, a tunable vertical cavity surface emitting laser (VCSEL) 50 can be constructed by positioning a gain region (or "active region") 55 between bottom mirror 15 and bottom electrode 20. As a result, when gain region 55 is appropriately stimulated, e.g., by optical pumping, lasing can be established between top mirror 40 and bottom mirror 15. Furthermore, by applying an appropriate voltage across top electrode 30 and bottom electrode 20, the position of top mirror 40 can be changed relative to bottom mirror 15, whereby to change the length of the laser's resonant cavity, and hence tune VCSEL 50.

Tunable Fabry-Perot filters and tunable VCSEL's of the type disclosed above are advantageous, since they can be quickly and easily tuned to a desired wavelength by simply changing the voltage applied across the top electrode and the bottom electrode.

However, it has also been found that tunable Fabry-Perot filters and tunable VCSEL's of the type disclosed above have performance characteristics which can vary slightly from unit to unit. In addition, it has also been found that the performance characteristics of any given unit can vary slightly in accordance with its age, temperature, etc. Accordingly, it is generally not possible to precisely predict in advance the exact voltage which must be applied to a particular device in order to tune that device to a specific wavelength. This can present an issue in some applications, particularly telecommunications applications, where the devices may need to be tuned to precise, known wavelengths (e.g., to the ITU WDM grid).

The present invention is based on the fact that the gap of a Fabry-Perot cavity determining the working wavelength, and hence resonance frequency of a tunable device, can be found from the electric capacitance of the cavity using the following formula:

$$C(x) = (\epsilon_0 \cdot \epsilon \cdot A)/x$$

where $\epsilon_0$=the dielectric constant of a vacuum;
$\epsilon$=the dielectric constant of the substance filling the cavity;
A=the cavity cross-section; and
x =the distance of the cavity gap.

The cavity wavelength can be found in the first approximation as follows:

$$\lambda := x/n,$$

where n=Fabry-Perot cavity order.

It is important to note that using an AC based capacitance measurement will allow a reduction of the influence of polarization of various layers of device structure of filter 5 or VCSEL 50 on the result of the gap measurement between bottom and top electrodes 20 and 30. Accordingly, the accuracy with which the wavelength is defined is increased.

A convenient method to measure the capacitance between bottom and top electrodes 20 and 30 is to create an LC (where L is inductance and C is capacitance of the cavity) circuit or an RC (where R is resistance) circuit and characterize the electric frequency response of this circuit. Since the value of L or R is known, the value of C can be found. Placing the inductor L or resistor R inside a thermally stabilized and hermetically sealed telecommunication package makes the inductance and resistance values more stable, thereby improving the accuracy of capacitance (and thus wavelength) measurement.

In the present invention, two preferred methods, and apparatus associated with each of the methods, are shown hereinbelow to implement the above capacitance measurement.

Figure 3:
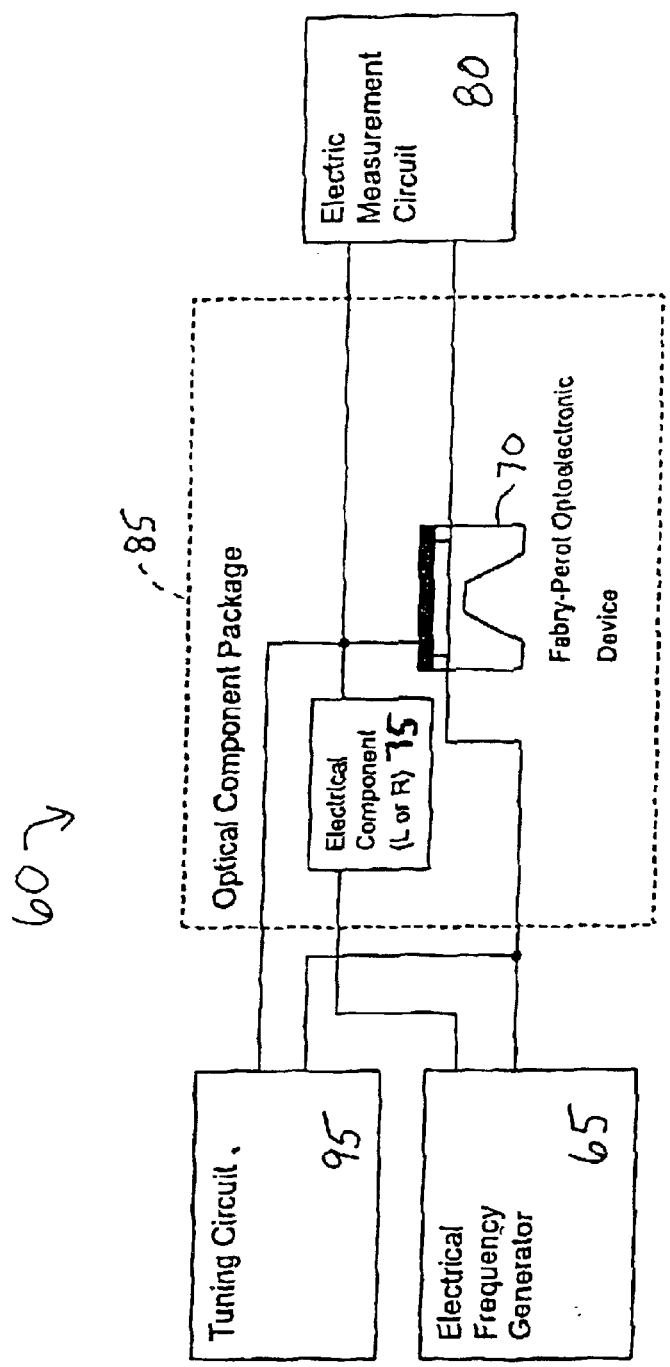
FIG. 3 is a schematic diagram of a first novel circuit implementing a method and apparatus for optical tunable device capacitance measurement in accordance with the present invention.

Referring to FIG. 3, there is shown a circuit 60 implementing a first method for optical tunable device capacitance measurement, which involves providing an electrical frequency generator 65. The output signal from electrical frequency generator 65 is provided to the RC or LC circuit 60 that contains the Fabry-Perot optical tunable device 70 and electrical element 75. The response of circuit 60 to the input frequency signal is detected with an electric measurement circuit 80. Fabry-Perot optical tunable device 70 and electrical element 75 are located inside the optical package 85. A tuning circuit 95 generates a tuning signal that controls the wavelength of Fabry-Perot optical tunable device 70.

The first method involves providing an electrical frequency generator 65, feeding its signal to the RC or LC circuit 60 (containing the Fabry-Perot optical tunable device 70) and detecting the reaction of circuit 60 to the input frequency of electrical frequency generator 65, and wherein the optical wavelength is determined therefrom using the formula described above.

A second method involves construction of an electrical oscillator where the electrical capacitance of the Fabry-Perot optical tunable device is a part of a frequency setting circuit. Measuring the frequency of the generated signal allows determination of the capacitance of the optical tunable device and, in turn, this capacitance is used to determine optical wavelength generated by the optical tunable device.

Figure 4:
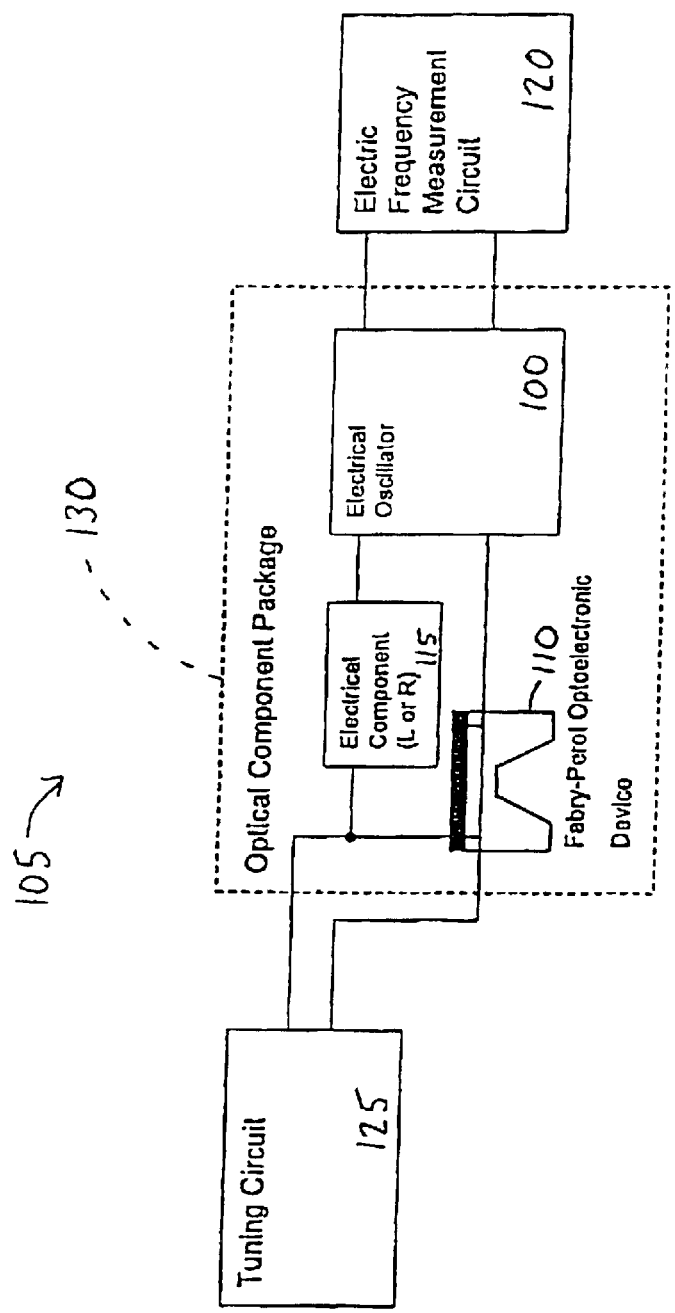
FIG. 4 is a schematic diagram of a second novel circuit implementing a method and apparatus for optical tunable device capacitance measurement in accordance with the present invention.

Looking now at FIG. 4, there is shown one implementation of the second capacitance measurement method that involves construction of an electrical oscillator 100. A frequency setting circuit 105 includes the electrical capacitance of the Fabry-Perot optical tunable device 110 in concert with the electrical component 115. Measuring the frequency of the generated signal by the electric frequency measurement circuit 120 allows determination of the capacitance of the optical device and thus determines the optical wavelength. Tuning circuit 125 generates a tuning signal that controls the wavelength of Fabry-Perot optical tunable device 110.

Still looking at FIG. 4, in a preferred embodiment of the invention, electrical Oscillator 100, Fabry-Perot optoelectronic device 110, and electrical component 115 are disposed inside the optical component package 130 so as to provide a strictly controlled environment. This environment, in turn, improves the accuracy of the capacitance measurement.

Both the methods and apparatus described above can be used in optical wavelength locking as well as wavelength referencing applications. In wavelength referencing applications, the optical wavelength is measured in accordance with either of the two methods described above and may be used as a direct measurement.

In wavelength locking applications, the electrical signal generated by one of the two methods representing the optical wavelength is used as a feedback signal in an electrical closed loop control circuit. For instance, an optical tunable device may be locked to a certain optical wavelength by defining a corresponding electrical signal frequency. An oscillator circuit, including the electrical capacitance of the Fabry-Perot optical tunable device as part of a frequency setting circuit, can be considered a controlled variable frequency oscillator. The frequency of this oscillator can be locked to a stable reference frequency using a Phase-locked Loop (PLL) thus locking the working optical wavelength of a tunable Fabry-Perot optical filter or VCSEL to a certain wavelength value. And this frequency can be an optical wavelength value corresponding to a channel on the ITU grid.

It will be recognized that many configurations similar to those described above can be designed using different values, combinations and architectures which will yield the same results as the claimed invention. Thus, while this invention has been particularly shown and described with references to preferred embodiments herein, it is understood by those skilled in the art that various changes in form and details may be made therein without departing from the scope of the invention as defined by the appended claims.

What is claimed is:

1. An apparatus for measuring a selected optical behavior of a tunable opto-electronic device by using capacitance characteristics of said tunable opto-electronic device, said apparatus comprising:
   a first electrical component comprising at least one of a resistor and an inductor and having known electrical characteristics, said first electrical component being coupled to said tunable opto-electronic device to form at least one of an RC and an LC circuit with said capacitance characteristics of said tunable opto-electronic device, such that the RC or LC circuit generates an electrical signal representative of said selected optical behavior of said tunable opto-electronic device.

2. An apparatus according to claim 1 wherein said first electrical component allows determination of capacitance between a first electrode and a second electrode of said tunable opto-electronic device using the known characteristics of said first electrical component.

3. An apparatus according to claim 2 wherein said selected optical behavior comprises a resonant frequency of said tunable opto-electronic device, and further wherein said resonant frequency is determined by computing a distance of a cavity gap of said tunable opto-electronic device based on the capacitance characteristics of the tunable opto-electronic device as determined by said at least one component, and computing said resonant frequency of said tunable opto-electronic device based on said distance of said cavity gap.

4. An apparatus according to claim 1 further comprising a tuning circuit in electrical connection with said tunable opto-electronic devices wherein an electrical signal is applied to said tuning circuit based on said selected optical behavior of said tunable opto-electronic device as determined by said electrical signal of said RC or LC circuit.

5. An apparatus according to claim 1 wherein said first electrical component and said tunable opto-electronic device are coupled to one another in a single controlled environment.

6. An apparatus according to claim 1 further comprising an electrical frequency generator coupled to said first electrical component and said tunable opto-electronic device, wherein said electrical frequency generator applies a signal through said tunable opto-electronic device and said first electrical component coupled to one another.

7. Apparatus according to claim 6 further comprising an electric measurement circuit coupled to both said first electrical component and said tunable opto-electronic device coupled to one another, wherein said electric measurement circuit derives said capacitance characteristics of said tunable opto-electronic device.

8. Apparatus according to claim 1 further comprising an electrical oscillator coupled to said first electrical component and said tunable opto-electronic device, wherein said electrical oscillator applies a signal through both said tunable opto-electronic device and said first electrical component coupled to one another.

9. Apparatus according to claim 8 further comprising an electric frequency measuring circuit coupled to both said first electrical component and said tunable opto-electronic device coupled to one another, wherein said electric frequency measuring circuit derives said electrical characteristics of said tunable opto-electronic device.

10. Apparatus according to claim 8 wherein said first electronic component, said tunable opto-electronic device, and said electrical oscillator are coupled to one another in a single controlled environment.

11. A method for measuring a selected optical behavior of a tunable opto-electronic device by using capacitance characteristics of said tunable opto-electronic device, the method comprising the steps of:
   providing an electrical frequency generator and a first electrical component comprising at least one of an inductor and a resistor, said first electrical component coupled to said frequency generator and said tunable opto-electronic device to form at least one of an RC and LC circuit with the capacitance characteristic of said tunable opto-electronic device, and said tunable opto-electronic device coupled to said first electrical component and said frequency generator;
   applying a signal from said electrical frequency generator through said first electrical component and said tunable opto-electronic device;
   detecting an electrical response of said first electrical component from said signal applied by said electrical frequency generator so as to derive said capacitance characteristics of said tunable opto-electronic device; and
   determining said selected optical behavior of said tunable opto-electronic device by using said capacitance characteristics of said tunable opto-electronic device.

12. A method according to claim 11 wherein said selected optical behavior comprises a resonant frequency of said tunable opto-electronic device.

13. A method according to claim 12 further comprising a step of providing a tuning voltage to said tunable opto-electronic device based on said resonant frequency as determined by said capacitance characteristics of said tunable opto-electronic device.

14. A method according to claim 13 wherein said electrical response of said first electrical component is used to determine a capacitance between a pair of electrodes of said tunable opto-electronic device.

15. A method for measuring a selected optical behavior of a tunable opto-electronic device by using capacitance characteristics of said tunable opto-electronic device, the method comprising the steps of:
   providing an electrical oscillator and a first electrical component comprising at least one of an inductor and a resistor, said electrical oscillator being coupled to both said first electrical component and said tunable opto-electronic device, and said tunable opto-electronic device being coupled to both said electrical oscillator and said first electrical component, such that at least one of an LC and RC circuit is formed between the capacitance characteristic of the tunable opto-electronic device and the first electrical component;
   applying a signal from said electrical oscillator through said first electrical component and said tunable opto-electronic device;
   detecting an electrical response of said first electrical component from said signal applied by said electrical oscillator so as to derive said capacitance characteristics of said tunable opto-electronic device; and determining said selected optical behavior of said tunable opto-electronic device by using said capacitance of said tunable opto-electronic device.

16. A method according to claim 15 wherein said selected optical behavior comprises a resonant frequency of said tunable opto-electronic device.

17. A method according to claim 16 further comprising the step of providing a tuning voltage to said tunable opto-electronic device based on said resonant frequency.

18. A method according to claim 17 wherein said electrical response of said first electrical component is used to determine a capacitance between a pair of electrodes of said tunable opto-electronic device.

19. A method for measuring a selected optical behavior of a tunable opto-electronic device by using capacitance characteristics of said tunable opto-electronic device, the method comprising the steps of:

providing generation means for generating an electrical frequency and at least one of inductive means and resistive means coupled to the capacitance characteristics of the tunable opto-electronic device to form at least one of an inductive-capacitive means and a resistive-compacitive means for generating an electrical signal representative of said selected optical behavior of said tunable opto-electronic device;

applying a signal from said generation means through said at least one of inductive-capacitive means and resistive-capacitive means;

detecting an electrical response of said at least one of inductive-capacitive means and resistive-capacitive means from said signal applied by said generation means so as to derive said capacitance characteristics of said tunable opto-electronic device; and determining said selected optical behavior of said tunable opto-electronic device by using said derived capacitance characteristics of said tunable opto-electronic device.

20. A method for measuring a selected optical behavior of a tunable opto-electronic device by using capacitive characteristics of said tunable opto-electronic device, the method comprising steps of:

providing oscillation means for oscillating electrical current and at least one of inductive means and resistive means coupled to the capacitive characteristic of the tunable opto-electronic device to form at least one of an inductive-capacitive means and a resistive-capacitive means for generating an electrical signal representative of said selected optical behavior of said tunable opto-electronic device;

applying a signal from said generation means through said at least one of inductive-capacitive means and resistive-capacitive means;

detecting an electrical response of said at least one of inductive-capacitive means and resistive-capacitive means from said signal applied by said oscillation means so as to derive said capacitive characteristics of said tunable opto-electronic device; and determining said selected optical behavior of said tunable opto-electrode device by using said capacitive characteristics of said tunable opto-electronic device.

* * * * *